(12) United States Patent
Shindo et al.

(10) Patent No.: US 8,531,013 B2
(45) Date of Patent: Sep. 10, 2013

(54) SEMICONDUCTOR DEVICE EQUIPPED WITH BONDING WIRES AND MANUFACTURING METHOD OF SEMICONDUCTOR DEVICE EQUIPPED WITH BONDING WIRES

(75) Inventors: Teiji Shindo, Ome (JP); Shinji Ota, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 159 days.

(21) Appl. No.: 13/157,491

(22) Filed: Jun. 10, 2011

(65) Prior Publication Data

US 2011/0304031 A1    Dec. 15, 2011

(30) Foreign Application Priority Data

Jun. 11, 2010  (JP) ................................ 2010-134419
Jun. 11, 2010  (JP) ................................ 2010-134422
Jun. 11, 2010  (JP) ................................ 2010-134424
May 20, 2011  (JP) ................................ 2011-112969

(51) Int. Cl.
    *H01L 23/495*    (2006.01)
(52) U.S. Cl.
    USPC .......................................... 257/666; 438/123
(58) Field of Classification Search
    USPC ........... 257/666, E21.518, E23.033; 438/123
    See application file for complete search history.

(56) References Cited

U.S. PATENT DOCUMENTS 6,900,551 B2 * 5/2005 Matsuzawa et al. .......... 257/786
7,211,903 B2   5/2007 Miyaki et al.
7,323,788 B2   1/2008 Miyaki et al.
8,159,057 B2 * 4/2012 Okada et al. .................. 257/684
2002/0070446 A1 6/2002 Horiuchi et al.

FOREIGN PATENT DOCUMENTS

| JP | 5-333111 A     | 12/1993 |
| JP | 6-302638 A     | 10/1994 |
| JP | 10-247672 A    | 9/1998  |
| JP | 2002-184934 A  | 6/2002  |
| JP | 2005-101256 A  | 4/2005  |
| JP | 2005-191447 A  | 7/2005  |
| JP | 2006-332096 A  | 12/2006 |
| JP | 2007-019966 A  | 1/2007  |
| JP | 2007-235156 A  | 9/2007  |
| JP | 2009-288040 A  | 12/2009 |

OTHER PUBLICATIONS

Japanese Office Action dated Sep. 25, 2012 (and English translation thereof) in counterpart Japanese Application No. 2011-112969.

* cited by examiner

*Primary Examiner* — Phuc Dang
(74) *Attorney, Agent, or Firm* — Holtz, Holtz, Goodman & Chick, PC

(57) ABSTRACT

Disclosed is a semiconductor device including a printed-circuit board which includes a plurality of first electrodes, a plurality of second electrodes and a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above, and any of the plurality of first connection pads are used for a power voltage terminal and a system reset terminal of the semiconductor device.

46 Claims, 8 Drawing Sheets

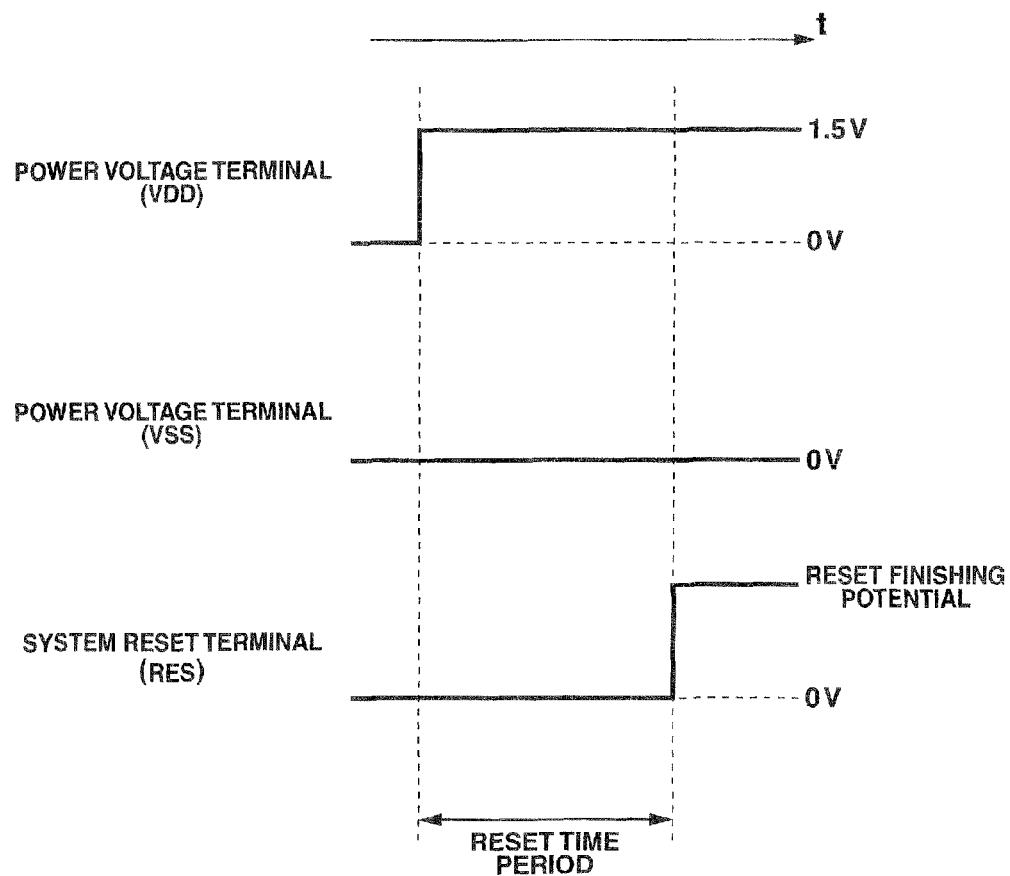

SEMICONDUCTOR DEVICE EQUIPPED WITH BONDING WIRES AND MANUFACTURING METHOD OF SEMICONDUCTOR DEVICE EQUIPPED WITH BONDING WIRES

BACKGROUND OF THE INVENTION

1. Field of the Invention

The present invention relates to a semiconductor device equipped with bonding wires and a manufacturing method of the semiconductor device equipped with bonding wires.

2. Description of Related Art

In JP 2006-332096, there is disclosed a semiconductor device in which a semiconductor chip, such as LSI (Large Scale Integration) in which connection pads are arranged in two lines, is mounted on a printed-circuit board by a wire-bonding.

Further, JP 2005-101256 discloses using aluminium (Al) as a material of a wire for bonding.

In a configuration where connection pads are provided at a semiconductor chip by being arranged in two lines, bonding wires are attached to the connection pads of the semiconductor chip which are in the outer line and thereafter, bonding wires are attached to the connection pads in the inner line at positions above the bonding wires which are already attached.

However, when a conductive test is to be carried out after all of the bonding wires are connected, the bonding wires of lower part cannot be detached unless the bonding wires of upper part which are attached later are detached when a bad electric contact is found in the bonding wires of lower part which are attached first. Therefore, there is a problem that the productivity is reduced.

SUMMARY OF THE INVENTION

It is, therefore, a main object of the present invention is to improve the productivity of semiconductor devices.

According to one aspect of the present invention, there is provided a semiconductor device including a printed-circuit board which includes a plurality of first electrodes, a plurality of second electrodes and a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above, and any of the plurality of first connection pads are used for a power voltage terminal and a system reset terminal of the semiconductor device.

According to another aspect of the present invention, there is provided a manufacturing method of a semiconductor device including preparing a printed-circuit board which includes a plurality of first electrodes, a plurality of second electrodes and a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above, and connecting the second connection pads to the second electrodes by second bonding wires after connecting the first connection pads to the first electrodes by first bonding wires.

BRIEF DESCRIPTION OF THE DRAWINGS

The present invention will become more fully understood from the detailed description given hereinbelow and the appended drawings, and thus are not intended as a definition of the limits of the present invention, and wherein:

FIG. 7 is an explanatory diagram of a reset time;

DESCRIPTION OF THE PREFERRED EMBODIMENT

Figure 1:
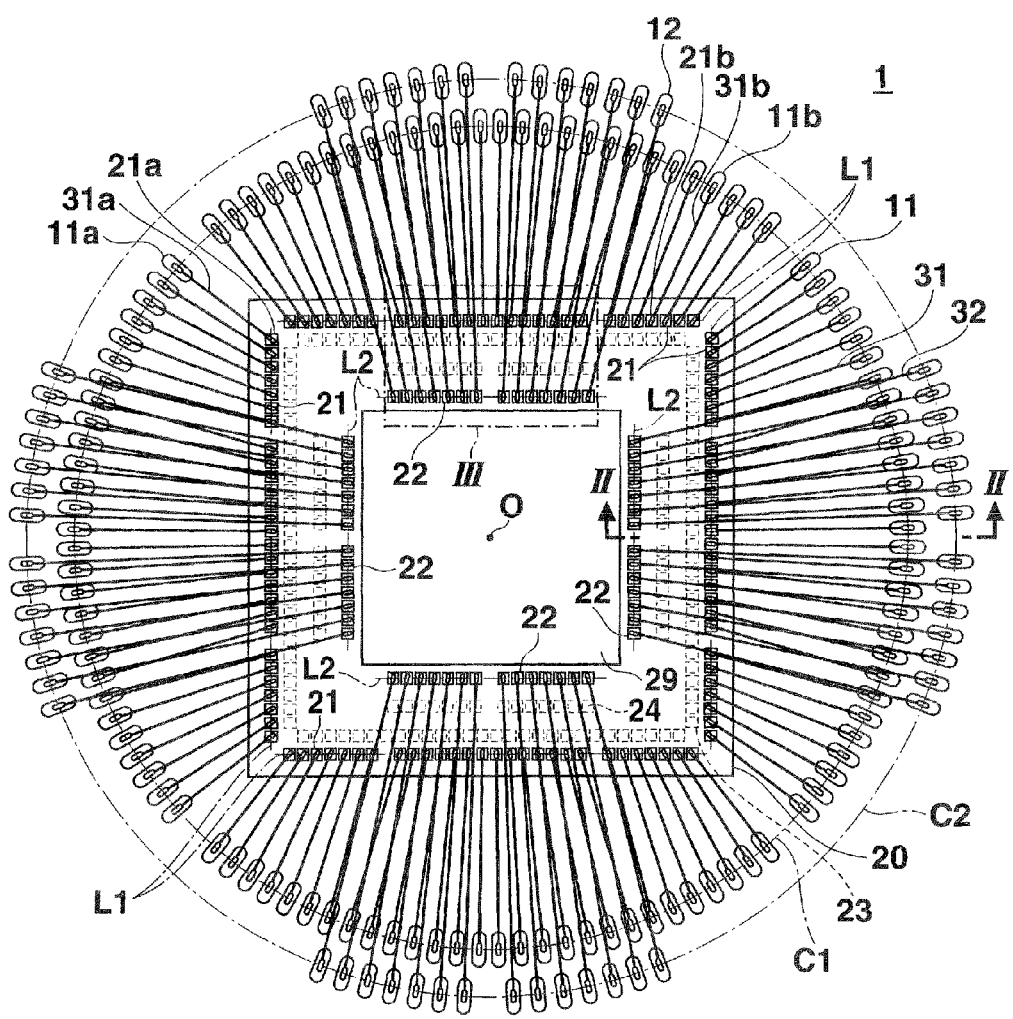
FIG. 1 is a plane view of a semiconductor device 1 according to an embodiment of the present invention.
Figure 2:
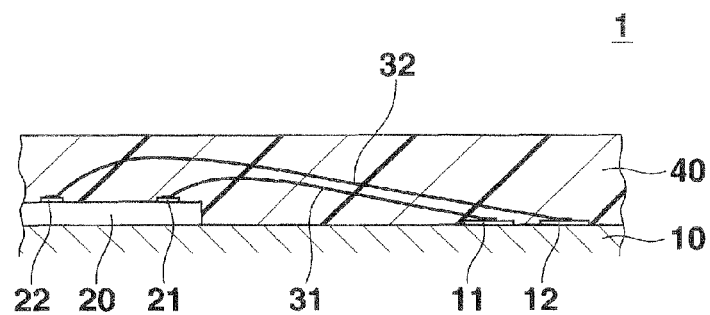
FIG. 2 is a sectional view when cut along the line II-II of FIG. 1.

FIG. 1 is a plane view of the semiconductor device 1 according to the embodiment of the present invention and FIG. 2 is a sectional view when cut along the line II-II of FIG. 1. The semiconductor device 1 includes a printed-circuit board 10, a semiconductor chip 20, first bonding wires 31, second bonding wires 32, an encapsulation layer 40 and the like.

The printed-circuit board 10 is a circuit board on which the semiconductor chip 20 is mounted or the like, and on the upper surface of the printed-circuit board 10, a plurality of first electrodes 11 and a plurality of second electrodes 12 are respectively formed on concentric circles C1 and C2 in which the part where the semiconductor ship 20 is to be mounted is set as the center thereof. Further, on the printed-circuit board 10, a wiring which is connected with each of the first electrodes 11 and a wiring which is connected with each of the second electrodes 12 are formed. Here, the number of the first electrodes 11 which are arranged on the concentric circle C1 which positions inside than the concentric circle C2 being closer to the semiconductor chip 20 is greater than the number of the second electrodes 12 which are arranged on the concentric circle C2 which positions outside of the concentric circle C1. An end of the first bonding wire 31 is fixed and electrically connected to each of the first electrodes 11, and an end of the second bonding wire 32, which is longer than the first bonding wire 31, is fixed and electrically connected to each of the second electrodes 12. Here, a first electrode 11a for input and a first electrode 11b for output are included in the first electrodes 11.

The outer circumference of the semiconductor chip 20 is roughly formed in a rectangular shape when seen from above thereof.

On one surface of the semiconductor chip 20, a plurality of first connection pads 21 are formed along the four sides of the outer circumference of the semiconductor chip 20. The lines which connect the centers of the adjacent first connection pads 21 which are formed along the sides of the outer circumference of the semiconductor chip 20 are parallel to the sides of the outer circumference of the semiconductor chip 20, respectively, and these lines are called the first lines L1. The first lines L1 are respectively disposed along the sides of the outer circumference of the semiconductor chip 20.

Further, when the intersection point of two diagonal lines which are line segments excluding the four sides of the semiconductor chip 20 among the line segments which connect the two corners of the rectangular shape of the semiconductor chip 20 is set to "O", a plurality of second connection pads 22 are formed on the one surface of the semiconductor chip 20 inside of the four first lines L1 on the semiconductor chip 20 having a shorter distance to the center O than the distance between the center O of the semiconductor chip 20 and the firs lines L1, when the semiconductor chip 20 is seen from above. The plurality of second connection pads 22 are formed along the first lines L1. The lines connecting the centers of the adjacent second connection pads 22 which are formed along the first lines L1 are parallel to the sides of the outer circumference of the semiconductor chip 20 and to the first lines L1, respectively, and these lines are called the second lines L2. The second lines L2 also respectively correspond to the sides of the outer circumference of the semiconductor chip 20.

The first connection pads 21 and the second connection pads 22 are electrodes at least including aluminium, for example. When the semiconductor chip 20 is seen from the above, the center of each of the first connection pads 21 overlaps the first line L1 and the first connection pads 21 are aligned on the first lines L1 by having a space between each other. When the semiconductor chip 20 is seen from the above, the centers of the second connection pads 22 overlap the second lines L2 which are positioned inside of the first lines L1 being closer to the center of the semiconductor chip 20 than the first lines 11 and the second connection pads 22 are aligned on the second lines L2 by having a space between each other. Here, the first lines L1 and the second lines L2 do not necessarily need to be parallel to each other, respectively.

In the portion (center portion of the semiconductor chip 20) inside of the second lines L2 which are arranged along four sides horizontally and vertically, an integrated circuit region 29 in which an integrated circuit is formed is provided. The first connection pads 21 and the second connection pads 22 in each side are disposed so as to alternate with each other in the direction of the first line L1 and the direction of the second line L2. That is, seeing from the direction orthogonal to each side, one of the second connection pads 22 of the second line L2 disposed along the side is arranged so as to overlap the border region between two first connection pads 21 which are adjacent to each other of the first line L1 disposed along the side. Further, at the same time, when seen from the direction orthogonal to each side, one of the first connection pads 21 of the first line L1 disposed along the side is arranged so as to overlap the border region between two second connection pads 22 which are adjacent to each other of the second line L2 disposed along the side.

The other end of the first bonding wire 31 is fixed and electrically connected to each of the first connection pads 21, and the other end of the second bonding wire 32 is fixed and electrically connected to each of the second connection pads 22.

In each side, the after-mentioned bonding head 50 is disposed between the first line L1 of the first connection pads 21 and the second line L2 of the second connection pads 22, the bonding head 50 having a length not contacting with both of the first connection pad 21 and the second connection pad 22 at the same time. Further, the distance between the first line L1 and the second line L2 is about 300 to 400 μm, for example.

Here, any of the first connection pads 21 of the first line L1 are used as the power voltage terminal (VDD terminal which is the power voltage of IC, VSS terminal which is the power voltage of IC to be used in a pair with VDD) and the system reset terminal, and the second connection pads 22 of the second line L2 are not to be used. The system reset terminal is a terminal to carry out the after-mentioned reset operation (initializing) so that the semiconductor chip 20 such as LSI operates normally. Further, as for the input terminal 21a and the output terminal 21b for carrying out the after-mentioned first conductive test, any of the first connection pads 21 of the first line L1 are also to be used. For example, when the semiconductor chip is to be used for liquid crystal display, there are a plurality of segment terminals, a plurality of common terminals, various types of output terminals and the like which are terminals to output signals for displaying the liquid crystal as the output terminals 21b. As described above, the first connection pads 21 of the firs line L1 are either one or a plurality of power voltage terminals (VDD, VSS), one system reset terminal, a plurality of input terminals 21a and a plurality of output terminals 21b. The majority of the plurality of the first connection pads 21 are the input terminals 21a and the output terminals 21b. Further, when the semiconductor chip is to be used for liquid display, the second connection pads 22 are a plurality of segment terminals, a plurality of common terminals, various types of output terminals or the like.

The first bonding wires 31 are disposed on the printed-circuit board 10, and the first bonding wires 31 connect between the first electrodes 11 which are disposed inside having a closer distance from the semiconductor chip 20 than the second electrodes 12 and the first connection pads 21 which are provided on the semiconductor chip 20 disposed outside having a longer distance from the center of the semiconductor chip 20 than the second connection pads 22, respectively. Here, the first bonding wires 31 include the first bonding wire 31a and the first bonding wire 31b. The second bonding wires 32 are disposed on the printed-circuit board 10, and the second bonding wires 32 connect between the second electrodes 12 which are disposed outside having a longer distance from the semiconductor chip 20 comparing to the first electrodes 11 and the second connection pads 22 which are provided on the semiconductor chip 20 disposed inside having a closer distance from the center of the upper surface of the semiconductor chip 20 comparing to the first connection pads 21. As shown in FIG. 2, the second bonding wires 32 are longer than the first bonding wires 31 and are formed at upper position than the first bonding wires 31.

The first bonding wires 31 and the second bonding wires 32 are formed of aluminium or an alloyed metal including aluminium. The first bonding wires 31 and the second bonding wires 32 are wires including aluminum having a diameter about 20 to 30 μm, and are wirings which connect the first electrodes 11 and the second electrodes 12 to the first connection pads and the second connection pads 22, respectively, by ultrasonic pressure bonding.

The encapsulation layer 40 is formed of an insulative resin, and the encapsulation layer 40 encapsulates the first bonding wires 31, the second bonding wires 32 and the printed-circuit board 10 and the semiconductor chip 20 which are connected by the first bonding wires 31 and the second bonding wires 32 and makes the first bonding wires 31 and the second bonding wires 32 which are adjacent to each other be insulated from each other.

Figure 3:
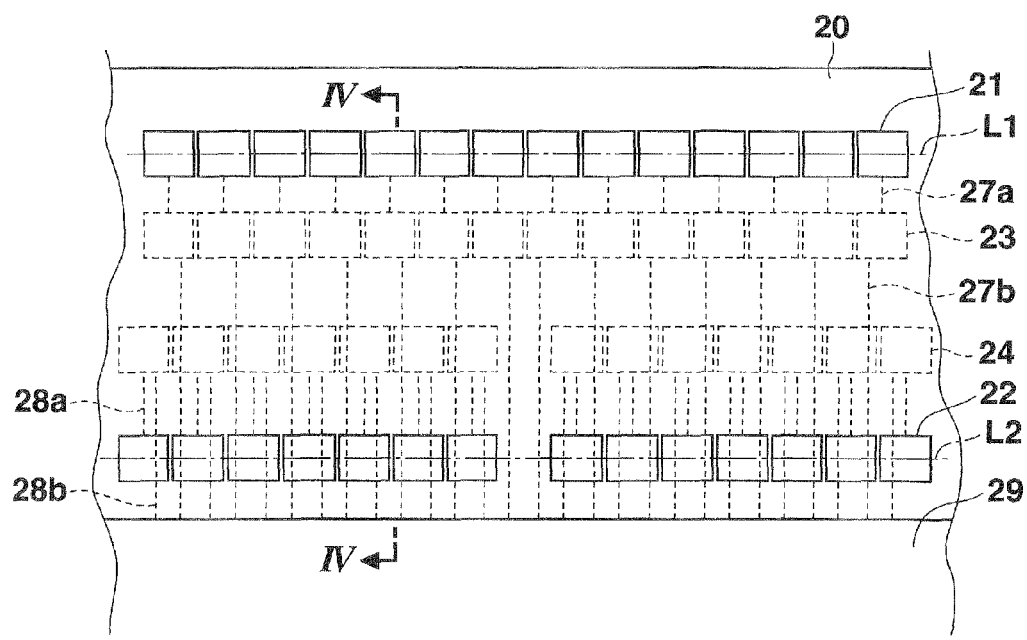
FIG. 3 is an enlarged plane view of a semiconductor chip 20 wherein the section III of FIG. 1 is enlarged.
Figure 4:
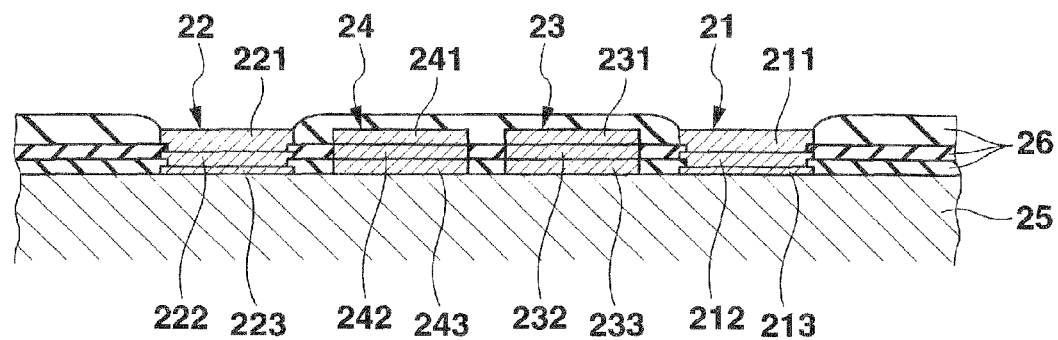
FIG. 4 is a sectional view when cut along the line IV-IV of FIG. 3.

FIG. 3 is an enlarged plane view of a semiconductor chip 20 wherein the section III of FIG. 1 is enlarged and FIG. 4 is a sectional view when cut along the line IV-IV of FIG. 3. As shown in FIGS. 3 and 4, on the semiconductor chip 20, circuit elements 23 and 24 such as semiconductor elements or the like are disposed between the first connection pads 21 arranged in the first lines L1 and the second connection pads 22 arranged in the second lines L2. The first connection pads 21 and the circuit elements 23 are respectively connected by the wirings 27a, and each of the circuit elements 23 and the circuit of the integrated circuit region 29 are connected by the wiring 27b. Similarly, the second connection pads 22 and the circuit elements 24 are respectively connected by the wirings 28a, and each of the circuit elements 24 and the circuit of the integrated circuit region 29 are connected by the wiring 28b.

The circuit elements 23 and 24 are protection circuits, for example, and the circuit elements 23 and 24 prevents abnormal voltage and current such as static, lightning surge or the like from being directly inputted to the circuit of the integrated circuit region 29 from the first connection pads 21 and the second connection pads 22. For example, a resist, a diode, a transistor, a condenser or the like may be used as the protection circuit elements. The protection circuit elements can be formed by laminating the inter-layer insulating film 26 and the conduction layer which is patterned on inside part or upper part of the semiconductor substrate 25 in a predetermined order.

Here, circuit elements other then the protection circuits may be disposed between the first lines L1 and the second lines L2, and for example, at least one of an operational amplifier, a voltage regulator and a logic circuit may be included.

At each of the four sides, a predetermined space is needed between the first connection pads 21 arranged on the first line L1 and the second connection pads 22 arranged on the second line L2 because of the size of the after-mentioned bonding head 50, and consequently, there is a possibility that the integration of the integrating circuit be reduced. However, by disposing the circuit elements between the first connection pads 21 and the second connection pads 22, the integration of the semiconductor chip 20 can be inhibited from being reduced.

Each of the first connection pads 21 is a laminated body of the conductive layers 211, 212 and 213, and the conductive layers 211, 212 and 213 are conductive with each other via the contact holes formed in each of the inter-layer insulating films 26. Each of the second connection pads 22 is a laminated body of the conductive layers 221, 222 and 223, and the conductive layers 221, 222 and 223 are conductive with each other via the contact holes formed in each of the inter-layer insulating films 26. The laminated body of the first connection pads 21 and the second connection pads 22 is not limited to the three-layer structure, and the laminated body can be formed of two layers or less or can be formed of four layers or more. Further, the inter-layer insulating film 26 can be formed of two layers or less or can be formed of four layers or more. Therefore, the first connection pads 21 may be formed of only the conductive layer 211 and the second connecting pads 22 can be formed of only the conductive layer 221.

Each of the circuit elements 23 is a laminated body of layers 231, 232 and 233, and each of the circuit elements 24 is a laminated body of layers 241, 242 and 243. The layer 231 can be formed at the same time as the layer 241 by patterning the layer of common material, the layer 232 can be formed at the same time as the layer 242 by patterning the layer of common material and the layer 233 can be formed at the same time as the layer 243 by patterning the layer of common material. The circuit elements 23 and 24 are not limited to the three layer structure, and the circuit elements 23 and 24 can be formed of two layers or less or may be formed of four layers or more. Further, the inter-layer insulating film 26 can be intervened between the layers.

Here, at least a part of the layers which constitute the circuit elements 23 and 24 can be formed at the same time as forming at least a part of the conductive layers of the first connection pads 21 and the second connection pads 22 by patterning the layer of common material.

Moreover, the circuit elements 23 and 24 can be formed in the semiconductor substrate 25 and not on the semiconductor substrate 25. Further, a part of the circuit elements 23 and 24 can be formed in the semiconductor substrate 25 and other part can be laminated on the semiconductor substrate 25.

Next, a manufacturing method of the semiconductor device 1 will be described by using FIGS. 5 to 8.

Figure 5:
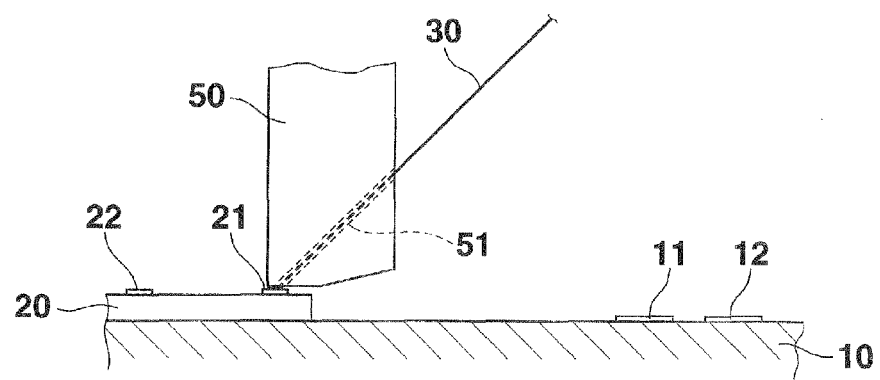
FIG. 5 is an explanatory diagram of a manufacturing method of the semiconductor device 1.

(1) First, as shown in FIG. 5, the tip portion of the bonding head 50 is placed on the first connection pad 21 in a state where the semiconductor chip 20 is placed on the printed-circuit board 10, wherein an A1 wire 30 which is to be the first bonding wires 31 and the second bonding wires 32 is inserted in the insertion hole 51 of the bonding head 50 and an end of the A1 wire 30 extending from the insertion hole 51 is places at the tip portion of the bonding head 50. Thereafter, the end of the A1 wire 30 is pressed against the first connection pad 21 by the tip portion of the bonding head 50 to be squished and the ultrasonic pressure bonding is carried out.

Figure 6A:
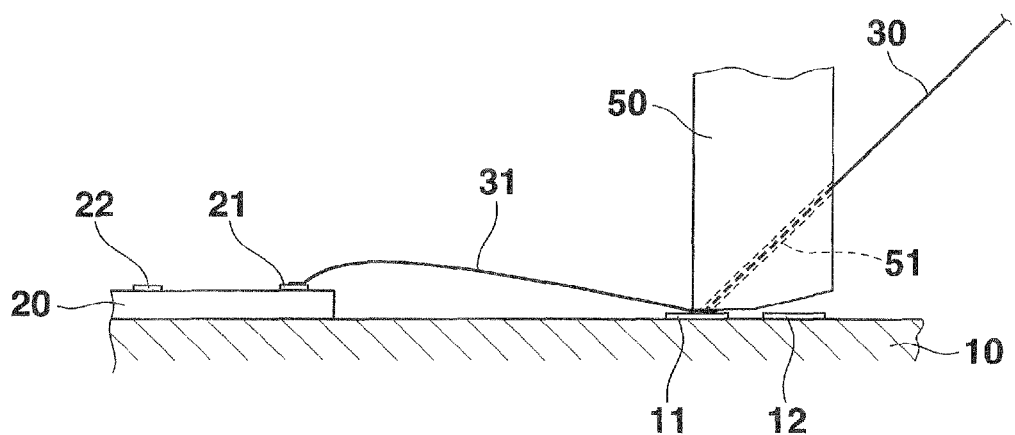
FIGS. 6A and 6B are explanatory diagrams of the manufacturing method of the semiconductor device 1.

(2) Next, as shown in FIG. 6A, the bonding head 50 is moved to the first electrode 11 so as to form a loop of the first bonding wire 31 while paying out the A1 wire 30 from the tip portion of the bonding head 50. By making the A1 wire 30 be biased in a shape of the loop according to the elasticity of the A1 wire 30, the A1 wire 30 can be prevented from contacting the adjacent first bonding wire 31.

Next, an end of the A1 wire 30 is pressed against the first electrode 11 by the tip portion of the bonding head 50 to be squished, and the first bonding wire 31 is formed by carrying out the ultrasonic pressure bonding thereto and cutting the A1 wire 30.

The first connection pad 21 and the first electrode 11 are connected by the first bonding wire 31 and then, the adjacent first connection pads 21 and first electrodes 11 are to be connected in an order. By repeating the processes of (1) and (2), all of the first electrodes 11 and the first connection pads 21 are respectively connected by the first bonding wires 31.

Figure 6B:
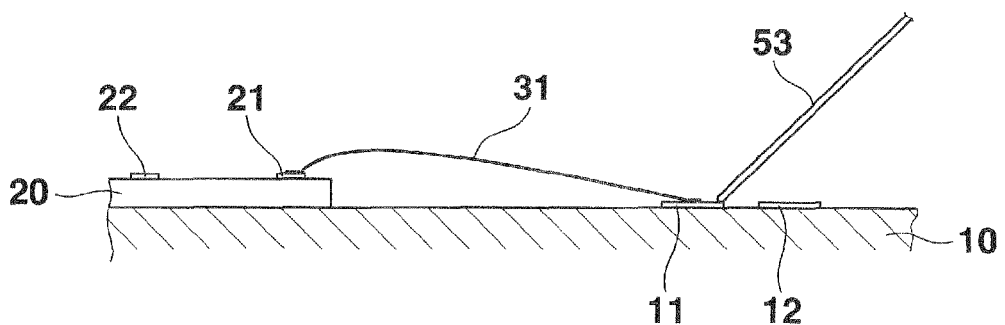

(3) Next, in the state shown in FIG. 6B, the first conductive test is carried out to all of the first bonding wires 31 . First, a plurality of probes 53 which are connected to the testing machine (not shown in the drawing) are made to contact a plurality of first electrodes 11 of the printed-circuit board 10, respectively. Next, as shown in FIG. 7, a voltage of 0V is applied to one system reset terminal (the first connecting pad 21 different from the power voltage terminal), for example. Further, voltage of 0V is applied to one or plurality of power voltage terminals (VSS). Continuously, after entering the reset time period, voltage of 1.5V is applied to the one or plurality of power voltage terminals (VDD). In such reset operation, the resister which maintains the inner condition of the circuit returns to the initial state while the system reset terminal is maintained at 0V. Next, by the testing machine changing the voltage being applied to the system reset terminal to the reset finishing potential of a predetermined voltage different from 0V after a predetermined time elapses since the rest time is started, the reset operation is ended.

Thereafter, in a state where all of the plurality of first electrodes 11 on the printed-circuit board 10 are being contacted by the plurality of probes 53, respectively, as shown in FIG. 1, the testing machine (not shown in the drawing) applies a signal for carrying out the first conductive test to each of the input terminals 21a via the probes 53, the first electrodes 11 for input and the first bonding wires 31. The signal which is applied to each of the input terminals 21a is outputted to the testing machine via the corresponding circuit of the integrated circuit region 29, the output terminals 21b, the first bonding wires 31b, the first electrodes 11b for output and the probes 53 which are respectively contacting the first electrodes 11b for output. According to the signal outputted to the testing machine, whether the first electrodes 11a for input and the input terminals 21a are respectively correctly connected by the first bonding wires 31a or not, whether the first electrodes lib for output and the output terminals 21b are respectively correctly connected by the first bonding wires 31b or not and whether the circuits in the integrated circuit region 29 are normal or not are determined.

In such way, because the first connection pads 21 of the first lines L1 are either one or plurality of power voltage terminals (VDD, VSS), one system reset terminal, a plurality of input terminals 21a and a plurality of output terminals 21b, the first conductive test for confirming whether there is a bad electric contact or not can be carried out to all of the first bonding wires 31 even in a state where the second bonding wires 31 are not formed. When a bad electric contact is found, the bad first bonding wire 31 is removed and a new first bonding wire 31 is connected before forming the second bonding wires 32, and the first conductive test is carried out again. Further, because the second bonding wires 32 are not formed at the time of the first test, the probes 53 can be made to contact the first electrodes 11 easily.

Figure 8:
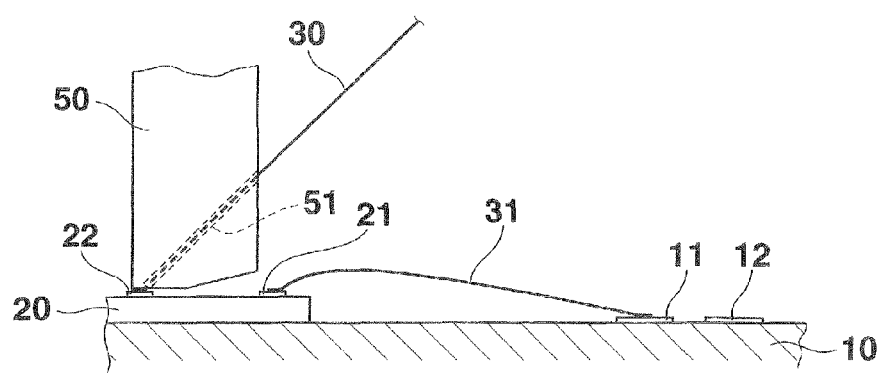
FIG. 8 is an explanatory diagram of the manufacturing method of the semiconductor device 1.

(4) After the first conductive test, as shown in FIG. 8, the end of the A1 wire 30 which is extended from the insertion hole 51 is disposed at the tip portion of the bonding head 50 where the A1 wire 30 is inserted in the insertion hole 51, and the tip portion of the bonding head 50 is placed on the second connection pad 22. Then, the end of the A1 wire 30 is pressed against the second connection pad 22 and squished by the tip portion of the bonding head 50, and the ultrasonic pressure bonding is carried out.

Figure 9:
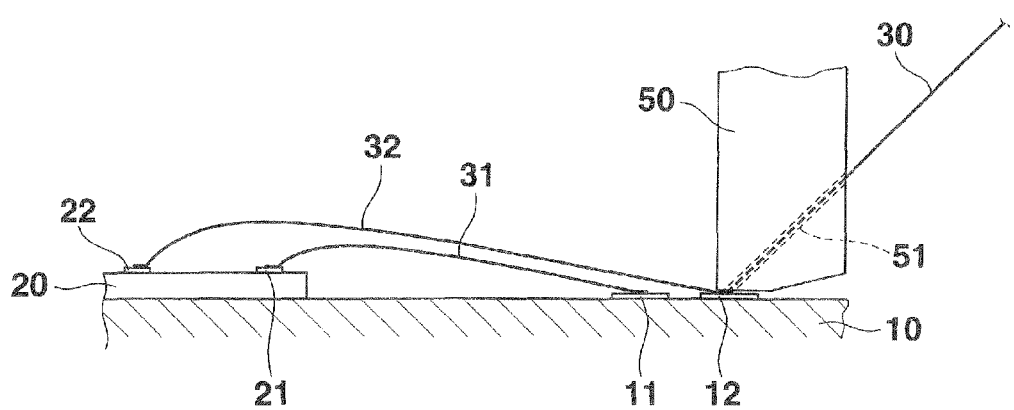
FIG. 9 is an explanatory diagram of the manufacturing method of the semiconductor device 1.

(5) Next, as shown in FIG. 9, the bonding head 50 is moved on to the second electrode 12 so as to form a loop of the second bonding wire 32 while paying out the A1 wire 30 from the tip portion of the bonding head 50. By making the A1 wire 30 be biased in a shape of the loop according to the elasticity of the A1 wire 30, the A1 wire 30 can be prevented from contacting the already existing first bonding wires 31 and the adjacent second bonding wire 32.

Next, the end of the A1 wire 30 is pressed against the second electrode 12 and squished by the tip portion of the bonding head 50, and the first bonding wire 31 is formed by cutting the A1 wire 30 after carrying out the ultrasonic pressure bonding.

The tracks which are drawn by the insertion hole 51 exposed at the tip portion side of the bonding head 50 moving form the approximately loop shapes of the first bonding wires 31 and the second bonding wires 32. However, by moving the bonding head 50 so that the tracks which are drawn by the insertion hole 51 at the tip portion side of the bonding head 50 at the time of forming the second bonding wires 32 go over the tracks which are drawn by the insertion hole 51 at the tip portion side of the bonding head 50 at the time of forming the first bonding wires 31, the loops of the second bonding wires 32 are disposed at positions higher than the loops of the first bonding wires 31 so that the second bonding wires 32 and the bonding head 50 do not contact the first bonding wires 31.

(6) Next, the second conductive test is carried out to all of the first bonding wires 31 and the second bonding wires 32. In the above described procedure of (3), the first conductive test is already carried out and the bad first bonding wires 31 are removed and new bonding wires are connected. However, in the process of forming the second bonding wires 32, there are possibilities that the electric contact between the first connection pads 21 and the first bonding wires 31 be bad and that the electric contact between the first bonding wires 31 and the first electrodes 11 be bad. Therefore, the second conductive test is also carried out to the first bonding wires 31. However, the possibility of bad electric contact be found in the first bonding wires 31 after attaching the second bonding wires 32 is small. When a bad electric contact is found in the second bonding wires 32, the bad second bonding wire 32 is removed and a new second bonding wire 32 is connected, and the second conductive test is carried out again.

Here, when a bad electric contact is found in the first bonding wires 31, the bad first bonding wire 31 is removed and the second bonding wire 32 which needs to be removed in order to removed the bad first bonding wire 31 is also removed.

(7) Thereafter, an insulative resin which becomes the encapsulation layer 40 is applied to encapsulate the first bonding wires 31, the second bonding wires 32 and the printed-circuit board 10 and the semiconductor chip 20 which are connected by the first bonding wires 31 and the second bonding wires 32. By carrying out the above process, the mounting of the semiconductor chip 20 on to the printed-circuit board 10 is finished and the semiconductor device 1 is completed.

Figure 10:
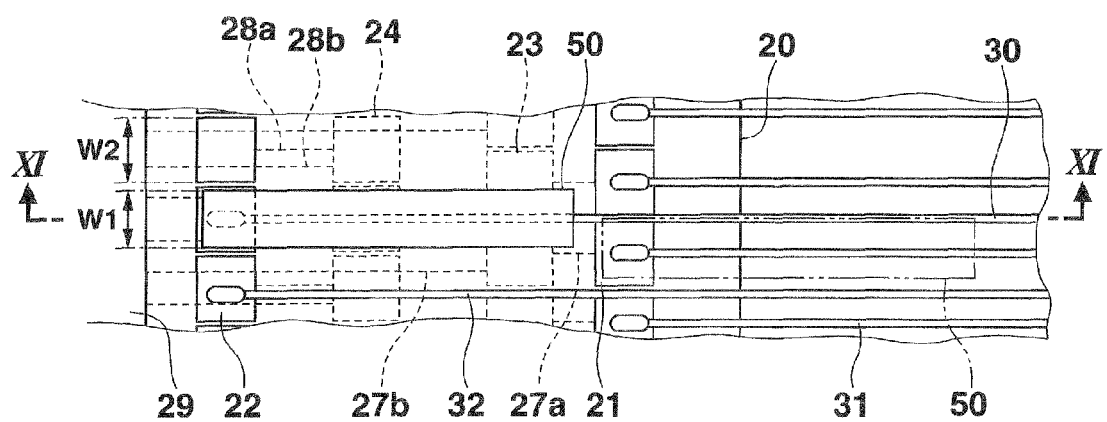
FIG. 10 is a plane view showing a positional relation between a bonding head 50 which forms second bonding wires 32, first connection pads 21, second connection pads 22 and first wires 31 which are already attached in a state shown in FIG. 8.
Figure 11:
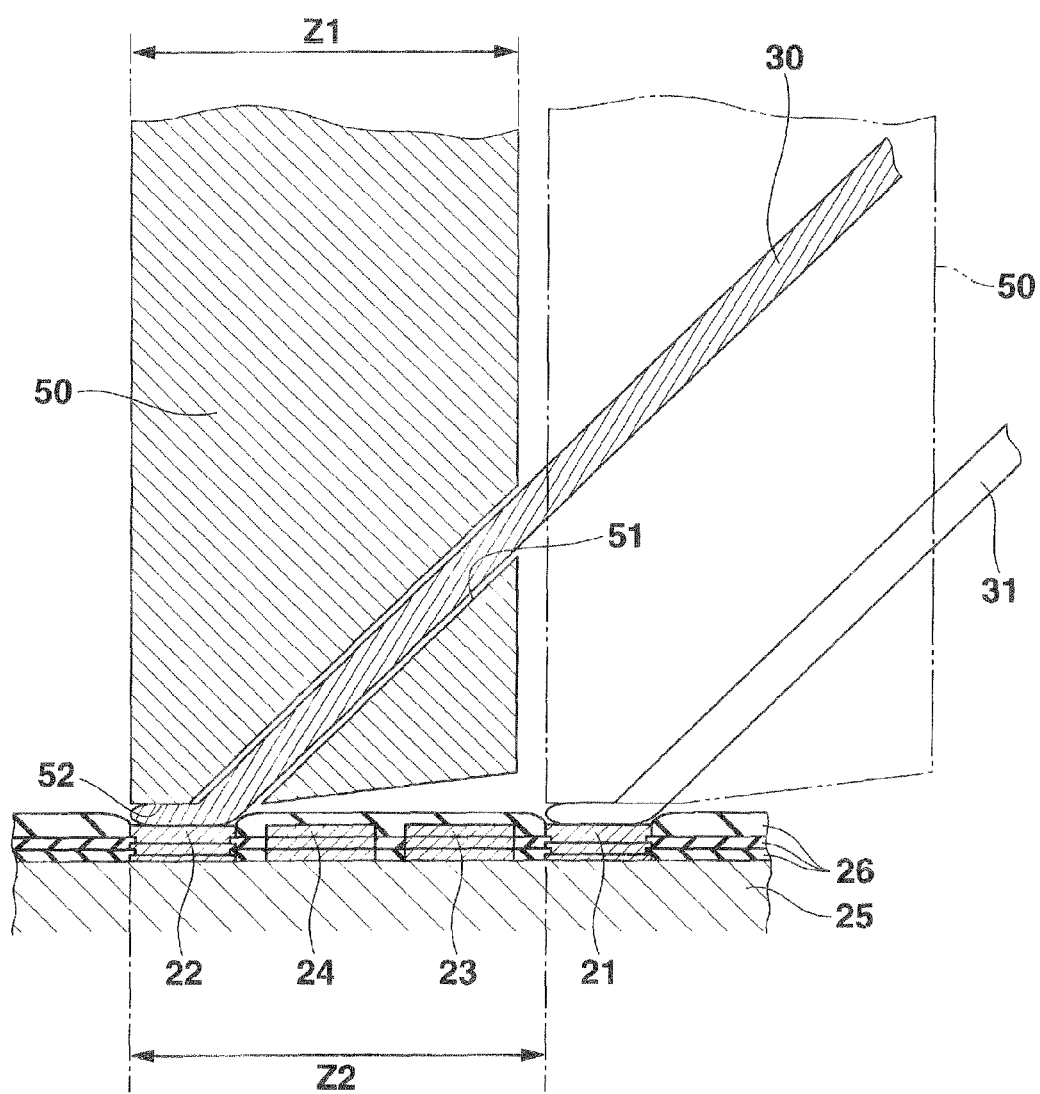
FIG. 11 is a sectional view when cut along the line XI-XI of FIG. 10.

Here, a plane view showing the positional relation between the bonding head 50 which forms the second bonding wires 32, the first connection pads 21, the second connection pads 22 and the already existing first bonding wires 31 in the state shown in FIG. 8 is shown in FIG. 10, and a sectional view when cut along the line XI-XI of FIG. 10 is shown in FIG. 11. As shown in FIGS. 10 and 11, the insertion hole 51 of the A1 wire 30 is formed at the tip portion of the bonding head 50. The end of the A1 wire 30 is pressed against the upper parts of the first electrodes 11, the second electrodes 12, the first connection pads 21 and the second connection pads 22 by the pressing portion 52 at the tip portion of the bonding head 50, and the ultrasonic pressure bonding is carried out.

As shown in FIG. 11, the length Z1 of the bonding head 50 in the direction in which the bonding head 50 pays out the A1 wire 30 is set to be shorter than the distance Z2 from the inner end of the second connection pad 22 to the inner end of the first connection pad 21, when the semiconductor chip 20 is seen from above, so that the bonding head 50 does not contact the first bonding wire 31 in a state where the pressing portion 52 at the tip portion of the bonding head 50 pressing the A1 wire 30 against the second connection pad 22. Further, as shown in FIG. 10, the width W1 of the bonding head 50 equals to or is shorter than the width W2 of the second connection pad 22.

The dashed-dotted lines in FIGS. 10 and 11 are shown as a reference showing the position of the bonding head 50 when attaching the first bonding wire 31 to the first connection pad 21. For instance, when the first bonding wires 31 are to be formed after forming the second bonding wires 32, the bonding head 50 contacts the second bonding wires 32, and therefore, it is difficult to insert the bonding head 50 in the space between the second bonding wires 32 which are already formed. Further, there is a case where the second bonding wires 32 pass above the first connection pads 21, and this makes it even difficult for the bonding head 50 to be inserted in the space.

In the embodiment, after connecting the first electrodes 11 and the first connection pads 21 by the first bonding wires 31, the second electrodes 12 which are disposed outside than the first electrodes 11 and the second connection pads 22 which are disposed inside than the first connection pads 21 are connected by the second bonding wires 32 at the positions higher than the first bonding wires 31. Therefore, the first bonding wires 31 do not interfere with the forming of the second bonding wires 32, and the wiring can be more flexible.

Moreover, the circuit elements 23 and 24 are disposed between the first lines L1 of the first connection pads 21 and the second lines L2 of the second connection pads 22. Therefore, the integration degree of the semiconductor chip 20 can be increased.

Furthermore, the first connection pads 21 and the second connection pads 22 are disposed so as to alternate each other in the direction of the first lines L1 and the second lines L2. Therefore, the first bonding wires 31 and the second banding wires 32 which are adjacent to each other are less subject to contacting each other.

According to a first aspect of the preferred embodiment of the present invention, there is provided a semiconductor device including a printed-circuit board which includes a plurality of first electrodes, a plurality of second electrodes and a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above, and any of the plurality of first connection pads are used for a power voltage terminal and a system reset terminal of the semiconductor device.

Preferably, the semiconductor device further includes first bonding wires which connect the first connection pads and the first electrodes and second bonding wires which connect the second connection pads and the second electrodes.

Preferably, the second bonding wires are longer than the first bonding wires and are disposed more at upper side than the first bonding wires.

Preferably, any of the first connection pads are used for an input terminal and an output terminal of the first bonding wires.

Preferably, the first bonding wires and the second bonding wires are formed of aluminium or an alloy metal including aluminium.

Preferably, the first connection pads and the second connection pads are arranged so as to alternate with each other in a line direction.

Preferably, the first electrodes are disposed on the printed-circuit board more inside than the second electrodes when seen from above.

Preferably, the first bonding wires and the second bonding wires are encapsulated by an encapsulation layer.

Preferably, a circuit element is provided between the first connection pads and the second connection pads.

Preferably, the circuit element is a protection circuit, and any of a resistance, a diode, a transistor and a condenser is used as a protection circuit element.

According to a second aspect of the preferred embodiments of the present invention, there is provided a manufacturing method of a semiconductor device including preparing a printed-circuit board which includes a plurality of first electrodes, a plurality of second electrodes and a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above, and connecting the second connection pads to the second electrodes by second bonding wires after connecting the first connection pads to the first electrodes by first bonding wires.

Preferably, a conductive between the first connection pads and the first electrodes is confirmed after connecting the first connection pads to the first electrodes by the first bonding wires.

Preferably, a conductive between the second connection pads and the second electrodes is confirmed after connecting the second connection pads to the second electrodes by the second bonding wires.

Preferably, any of the plurality of first connection pads are used as a power voltage terminal, a system reset terminal and an input terminal.

Preferably, the second bonding wires are longer than the first bonding wires and are disposed more at upper side than the first bonding wires.

Preferably, the first bonding wires and the second bonding wires are formed of aluminium or an alloy metal including aluminium, and the first bonding wires and the second bonding wires are respectively bonded with the first electrodes, the second electrodes, the first connection pads and the second connection pads by an ultrasonic pressure bonding.

Preferably, a circuit element is provided between the first connection pads and the second connection pads.

Preferably, the circuit element is a protection circuit, and any of a resistance, a diode, a transistor and a condenser is used as a protection circuit element.

Preferably, an end of a wire is pressed against the first connection pad or the second connection pad and squished by a tip portion of a bonding head and an ultrasonic pressure bonding is carried out, thereafter, the bonding head is moved on to the first electrode or the second electrode so as to form a loop of a bonding wire while paying out the wire from the tip portion of the bonding head, the end of the wire is pressed against the first electrode or the second electrode and squished by the tip portion of the bonding head and the wire is cut after the ultrasonic pressure bonding is carried out, and the first connection pad and the first electrode are connected by the first bonding wire and the second connection pad and the second electrode are connected by the second bonding wire.

Preferably, the first connection pads and the second connection pads are disposed so as to alternate with each other in a line direction.

Preferably, the first electrodes are disposed on the printed-circuit board more inside than the second electrodes when seen from above.

Preferably, the first bonding wires and the second bonding wires are encapsulated by an encapsulation layer.

Preferably, when a bad electric contact is found in the first bonding wires by a conductive confirming, a bad first bonding wire is removed and a new bonding wire is connected, and the conductive confirming is carried out again.

The present U.S. patent application claims a priority under the Paris Convention of Japanese Patent Application No. 2010-134419 filed on Jun. 11, 2010, Japanese Patent Application No. 2010-134422 filed on Jun. 11, 2010, Japanese Patent Application No. 2010-134424 filed on Jun. 11, 2010 and Japanese Patent Application No. 2011-112969 filed on May 20, 2011, which shall be a basis of correction of an incorrect translation.

Although various exemplary embodiments have been shown and described, the invention is not limited to the embodiments shown. Therefore, the scope of the invention is intended to be limited solely by the scope of the claims that follow.

What is claimed is:

1. A semiconductor device, comprising:
   a printed-circuit board which comprises:
      a plurality of first electrodes;
      a plurality of second electrodes; and
      a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above,
   wherein any of the plurality of first connection pads are used for a power voltage terminal and a system reset terminal of the semiconductor device, and
   wherein a circuit element is provided between the first connection pads and the second connection pads.

2. The semiconductor device as claimed in claim 1, further comprising:
   first bonding wires which connect the first connection pads and the first electrodes; and
   second bonding wires which connect the second connection pads and the second electrodes.

3. The semiconductor device as claimed in claim 2, wherein the second bonding wires are longer than the first bonding wires and are disposed closer to an upper side of the semiconductor device than the first bonding wires.

4. The semiconductor device as claimed in claim 2, wherein any of the first connection pads are used for an input terminal and an output terminal of the first bonding wires.

5. The semiconductor device as claimed in claim 2, wherein the first bonding wires and the second bonding wires are formed of aluminium or an alloy metal including aluminium.

6. The semiconductor device as claimed in claim 2, wherein the first bonding wires and the second bonding wires are encapsulated by an encapsulation layer.

7. The semiconductor device as claimed in claim 1, wherein the first connection pads and the second connection pads are arranged so as to alternate with each other in a line direction.

8. The semiconductor device as claimed in claim 1, wherein the first electrodes are disposed on the printed-circuit board closer to an inside of the printed-circuit board than the second electrodes when seen from above.

9. The semiconductor device as claimed in claim 1, wherein:
   the circuit element is a protection circuit element, and
   any of a resistance, a diode, a transistor and a condenser is used as the protection circuit element.

10. A manufacturing method of a semiconductor device, comprising:
    preparing a printed-circuit board which comprises: (i) a plurality of first electrodes; (ii) a plurality of second electrodes; and (iii) a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above; and
    connecting the second connection pads to the second electrodes by second bonding wires after connecting the first connection pads to the first electrodes by first bonding wires,
    wherein:
       a conductivity between the first connection pads and the first electrodes is confirmed after connecting the first connection pads to the first electrodes by the first bonding wires, and
       when a bad electric contact is found in the first bonding wires in the confirming of the conductivity, a bad first bonding wire is removed and a new bonding wire is connected, and the confirming of the conductivity is carried out again.

11. The manufacturing method of the semiconductor device as claimed in claim 10, wherein a conductivity between the second connection pads and the second electrodes is confirmed after connecting the second connection pads to the second electrodes by the second bonding wires.

12. The manufacturing method of the semiconductor device as claimed in claim 10, wherein any of the plurality of first connection pads are used as a power voltage terminal, a system reset terminal and an input terminal.

13. The manufacturing method of the semiconductor device as claimed in claim 10, wherein the second bonding wires are longer than the first bonding wires and are disposed closer to an upper side of the semiconductor device than the first bonding wires.

14. The manufacturing method of the semiconductor device as claimed in claim 10, wherein:
    the first bonding wires and the second bonding wires are formed of aluminium or an alloy metal including aluminium, and
    the first bonding wires and the second bonding wires are respectively bonded with the first electrodes, the second electrodes, the first connection pads and the second connection pads by an ultrasonic pressure bonding.

15. The manufacturing method of the semiconductor device as claimed in claim 10, wherein a circuit element is provided between the first connection pads and the second connection pads.

16. The manufacturing method of the semiconductor device as claimed in claim 15, wherein:
    the circuit element is a protection circuit element, and
    any of a resistance, a diode, a transistor and a condenser is used as the protection circuit element.

17. The manufacturing method of semiconductor device as claimed in claim 10, wherein:
    an end of a wire is pressed against the first connection pad or the second connection pad and squished by a tip portion of a bonding head and an ultrasonic pressure bonding is carried out,
    thereafter, the bonding head is moved on to the first electrode or the second electrode so as to form a loop of a bonding wire while paying out the wire from the tip portion of the bonding head,
    the end of the wire is pressed against the first electrode or the second electrode and squished by the tip portion of the bonding head and the wire is cut after the ultrasonic pressure bonding is carried out, and
    the first connection pad and the first electrode are connected by the first bonding wire and the second connection pad and the second electrode are connected by the second bonding wire.

18. The manufacturing method of the semiconductor device as claimed in claim 10, wherein the first connection pads and the second connection pads are disposed so as to alternate with each other in a line direction.

19. The manufacturing method of the semiconductor device as claimed in claim 10, wherein the first electrodes are disposed on the printed-circuit board closer to an inside of the printed-circuit board than the second electrodes when seen from above.

20. The manufacturing method of the semiconductor device as claimed in claim 10, wherein the first bonding wires and the second bonding wires are encapsulated by an encapsulation layer.

21. The manufacturing method of the semiconductor device as claimed in claim 10 wherein the conductivity between the first connection pads and the first electrodes is confirmed, the bad first bonding wire is removed, and the new bonding wire is connected, before the second connection pads are connected to the second electrodes by the second bonding wires.

22. A manufacturing method of a semiconductor device, comprising:
preparing a printed-circuit board which comprises: (i) a plurality of first electrodes; (ii) a plurality of second electrodes; and (iii) a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above; and
connecting the second connection pads to the second electrodes by second bonding wires after connecting the first connection pads to the first electrodes by first bonding wires,
wherein a circuit element is provided between the first connection pads and the second connection pads.

23. The manufacturing method of the semiconductor device as claimed in claim 22, wherein a conductivity between the first connection pads and the first electrodes is confirmed after connecting the first connection pads to the first electrodes by the first bonding wires.

24. The manufacturing method of the semiconductor device as claimed in claim 23, wherein when a bad electric contact is found in the first bonding wires in the confirming of the conductivity, a bad first bonding wire is removed and a new bonding wire is connected, and the confirming of the conductivity is carried out again.

25. The manufacturing method of semiconductor device as claimed in claim 22, wherein a conductivity between the second connection pads and the second electrodes is confirmed after connecting the second connection pads to the second electrodes by the second bonding wires.

26. The manufacturing method of the semiconductor device as claimed in claim 22, wherein any of the plurality of first connection pads are used as a power voltage terminal, a system reset terminal and an input terminal.

27. The manufacturing method of the semiconductor device as claimed in claim 22, wherein the second bonding wires are longer than the first bonding wires and are disposed closer to an upper side of the semiconductor device than the first bonding wires.

28. The manufacturing method of the semiconductor device as claimed in claim 22, wherein:
the first bonding wires and the second bonding wires are formed of aluminium or an alloy metal including aluminium, and
the first bonding wires and the second bonding wires are respectively bonded with the first electrodes, the second electrodes, the first connection pads and the second connection pads by an ultrasonic pressure bonding.

29. The manufacturing method of the semiconductor device as claimed in claim 22, wherein:
the circuit element is a protection circuit element, and
any of a resistance, a diode, a transistor and a condenser is used as the protection circuit element.

30. The manufacturing method of semiconductor device as claimed in claim 22, wherein:
an end of a wire is pressed against the first connection pad or the second connection pad and squished by a tip portion of a bonding head and an ultrasonic pressure bonding is carried out,
thereafter, the bonding head is moved on to the first electrode or the second electrode so as to form a loop of a bonding wire while paying out the wire from the tip portion of the bonding head,
the end of the wire is pressed against the first electrode or the second electrode and squished by the tip portion of the bonding head and the wire is cut after the ultrasonic pressure bonding is carried out, and
the first connection pad and the first electrode are connected by the first bonding wire and the second connection pad and the second electrode are connected by the second bonding wire.

31. The manufacturing method of the semiconductor device as claimed in claim 22, wherein the first connection pads and the second connection pads are disposed so as to alternate with each other in a line direction.

32. The manufacturing method of the semiconductor device as claimed in claim 22, wherein the first electrodes are disposed on the printed-circuit board closer to an inside of the printed-circuit board than the second electrodes when seen from above.

33. The manufacturing method of the semiconductor device as claimed in claim 22, wherein the first bonding wires and the second bonding wires are encapsulated by an encapsulation layer.

34. A manufacturing method of a semiconductor device, comprising:
preparing a printed-circuit board which comprises: (i) a plurality of first electrodes; (ii) a plurality of second electrodes; and (iii) a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above; and
connecting the second connection pads to the second electrodes by second bonding wires after connecting the first connection pads to the first electrodes by first bonding wires,
wherein:
an end of a wire is pressed against the first connection pad or the second connection pad and squished by a tip portion of a bonding head and an ultrasonic pressure bonding is carried out,
thereafter, the bonding head is moved on to the first electrode or the second electrode so as to form a loop of a bonding wire while paying out the wire from the tip portion of the bonding head,
the end of the wire is pressed against the first electrode or the second electrode and squished by the tip portion of the bonding head and the wire is cut after the ultrasonic pressure bonding is carried out, and the first connection pad and the first electrode are connected by the first bonding wire and the second connection pad and the second electrode are connected by the second bonding wire.

35. The manufacturing method of the semiconductor device as claimed in claim 34, wherein a conductivity between the first connection pads and the first electrodes is confirmed after connecting the first connection pads to the first electrodes by the first bonding wires.

36. The manufacturing method of the semiconductor device as claimed in claim 35, wherein when a bad electric contact is found in the first bonding wires in the confirming of the conductivity, a bad first bonding wire is removed and a new bonding wire is connected, and the confirming of the conductivity is carried out again.

37. The manufacturing method of the semiconductor device as claimed in claim 34, wherein a conductivity between the second connection pads and the second electrodes is confirmed after connecting the second connection pads to the second electrodes by the second bonding wires.

38. The manufacturing method of the semiconductor device as claimed in claim 34, wherein any of the plurality of first connection pads are used as a power voltage terminal, a system reset terminal and an input terminal.

39. The manufacturing method of the semiconductor device as claimed in claim 34, wherein the second bonding wires are longer than the first bonding wires and are disposed closer to an upper side of the semiconductor device than the first bonding wires.

40. The manufacturing method of the semiconductor device as claimed in claim 34, wherein:

the first bonding wires and the second bonding wires are formed of aluminium or an alloy metal including aluminium, and the first bonding wires and the second bonding wires are respectively bonded with the first electrodes, the second electrodes, the first connection pads and the second connection pads by an ultrasonic pressure bonding.

41. The manufacturing method of the semiconductor device as claimed in claim 34, wherein a circuit element is provided between the first connection pads and the second connection pads.

42. The manufacturing method of the semiconductor device as claimed in claim 41, wherein:

the circuit element is a protection circuit element, and any of a resistance, a diode, a transistor and a condenser is used as the protection circuit element.

43. The manufacturing method of the semiconductor device as claimed in claim 34, wherein the first connection pads and the second connection pads are disposed so as to alternate with each other in a line direction.

44. The manufacturing method of the semiconductor device as claimed in claim 34, wherein the first electrodes are disposed on the printed-circuit board closer to an inside of the printed-circuit board than the second electrodes when seen from above.

45. The manufacturing method of the semiconductor device as claimed in claim 34, wherein the first bonding wires and the second bonding wires are encapsulated by an encapsulation layer.

46. A manufacturing method of a semiconductor device, comprising:

preparing a printed-circuit board which comprises: (i) a plurality of first electrodes; (ii) a plurality of second electrodes; and (iii) a semiconductor chip on which a plurality of first connection pads are aligned in a first line being disposed along an outer circumference side of a top surface and a plurality of second connection pads are aligned in a second line being disposed inside of and apart from the first line, when the semiconductor chip is seen from above;

connecting the first connection pads to the first electrodes by the first bonding wires, and connecting the second connecting pads to the second electrodes by second bonding wires after a conductivity between the first connection pads and the first electrodes is confirmed.

* * * * *